United States Patent [19]
Jahns et al.

[11] Patent Number: 4,777,579
[45] Date of Patent: Oct. 11, 1988

[54] INTEGRATED CURRENT SENSOR CONFIGURATIONS FOR AC MOTOR DRIVES

[75] Inventors: Thomas M. Jahns, Schenectady, N.Y.; Eric J. Wildi, Chapel Hill, N.C.

[73] Assignee: General Electric Company, Schenectady, N.Y.

[21] Appl. No.: 140,686

[22] Filed: Jan. 4, 1988

[51] Int. Cl.⁴ .................................. H02M 7/5387
[52] U.S. Cl. ................................ 363/98; 363/132
[58] Field of Search ............... 363/17, 25, 26, 48, 363/132, 134

[56] References Cited

U.S. PATENT DOCUMENTS

| | | | |
|---|---|---|---|
| 3,870,943 | 3/1975 | Weischedel et al. | 363/26 |
| 4,126,819 | 11/1978 | Stobbe et al. | 363/132 |
| 4,233,658 | 11/1980 | Lupatin et al. | 363/134 |
| 4,351,020 | 9/1982 | Lati et al. | 363/26 |
| 4,533,836 | 8/1985 | Carpenter et al. | 363/17 |
| 4,710,686 | 12/1987 | Guzik | 363/98 |

OTHER PUBLICATIONS

C-E Cordonnier and D. L. Zaremba, Jr., "Application Considerations for SENSEFET ® Power MOSFET Devices", *Power Coversion International Conference Proceedings*, May 1987, pp. 47–65.

W. Schultz, "Lossless Current Sensing with SENSE-FETs Enhances Motor Drive Design", *Power Conversion and Intelligent Motion*, Apr. 1986, pp. 30–34.

S. Young, "Current Sensing HEX Sense Power MOSFETs Simplify SMPS Designs and Lower Losses", *Power Conversion and Intelligent Motion*, Jul. 1987, pp. 76–83.

*Primary Examiner*—Patrick R. Salce
*Assistant Examiner*—Jeffery Sterrett
*Attorney, Agent, or Firm*—Marvin Snyder; James C. Davis, Jr.

[57] ABSTRACT

An AC polyphase motor drive includes a current-controlled inverter comprising a plurality of semiconductor devices made up of power switches, such as IGBTs, and diodes. Current sensors integral with respective ones of a first group of the semiconductor devices sense the current delivered to each of the motor phase windings and a controller compares the sensed currents to a set of command signals to control operation of a second group of the semiconductor devices.

32 Claims, 8 Drawing Sheets

INTEGRATED CURRENT SENSOR CONFIGURATIONS FOR AC MOTOR DRIVES

The present invention relates in general to a current-controlled AC motor drive and more specifically to an AC motor drive using integrated current sensors built into the inverter switches.

BACKGROUND OF THE INVENTION

High-quality torque regulation for polyphase AC motors depends upon accurate control of instantaneous current in each of the motor phase windings. Such control requires that instantaneous phase current levels be accurately sensed. Present current-controlled AC drives use discrete current sensors in series with the motor phase windings to sense these phase current levels. One prior art technique of sensing current flow through such phase winding involves sensing the voltage drop developed across a resistor that is serially connected to the winding. Since the possible current range is large, the sensing resistor must have a relatively high power rating, which increases its cost. Alternatively, the current sensors may constitute high-quality Hall-effect transducers which are also relatively expensive. All these current sensors must be galvanically isolated from each other, as well as from the control logic, and must reject significant common-mode signals associated with the inverter switching in order to maintain integrity of the current data. While Hall-effect current sensors can meet these isolation requirements, they are temperature sensitive, bulky and fragile, and their output signals are subject to offset and drift. High-quality Hall-effect devices with improved performance characteristics are available, but at very high cost.

In addition to the above disadvantages, the volume and isolation requirements for discrete current sensors limit the possible reduction in size and weight of AC drives to be obtained through their use, even though the physical size of power semiconductors used in inverters continues to shrink. A power semiconductor device, such as an insulated gate bipolar transistor (IGBT) having a main current section and a current sensing section that emulates or follows the current in the main current section, is disclosed in Walden and Wildi patent application Ser. No. 892,739, filed July 31, 1986 as a file wrapper continuation of Ser. No. 529,240, filed Sept. 6, 1983, and assigned to the assignee of the present application. Although some IGBT switches having integrated current sensors have been fabricated into some AC drives, they function in those circuits solely to provide overcurrent threshold detection. As such, they do not provide the complete current information necessary for closed-loop current regulation.

OBJECTS OF THE INVENTION

It is a primary object of the invention to provide a new and improved current sensor configuration for an AC motor drive which is not subject to the foregoing disadvantages.

It is an additional object of the present invention to provide a new and improved current sensor for an AC motor drive which makes it possible to achieve current control without employing discrete current sensors in the individual motor phase windings.

It is another object of the present invention to provide a new and improved inverter which eliminates the volume and weight penalties imposed by conventional discrete current sensors.

It is a further object of the present invention to provide a new and improved inverter which can be constructed simply and economically.

SUMMARY OF THE INVENTION

In accordance with the principles of the present invention, an AC polyphase motor drive includes a current-controlled inverter having current sensing sections integrated in the inverter semiconductor switches and diodes. The current sensing sections are formed with the switch or diode in the same semiconductor fabrication process, and produce output current signals which are proportional to the main current in the switch or diode. Means are provided for converting the signal current from each current sensor into an output voltage proportional to the main current in the semiconductor devices.

The above objects and other objects of the present invention together with the features and advantages thereof will become apparent from the following detailed specification with reference to the accompanying drawings in which applicable reference numerals have been carried forward.

DETAILED DESCRIPTION OF THE INVENTION

Figure 1:
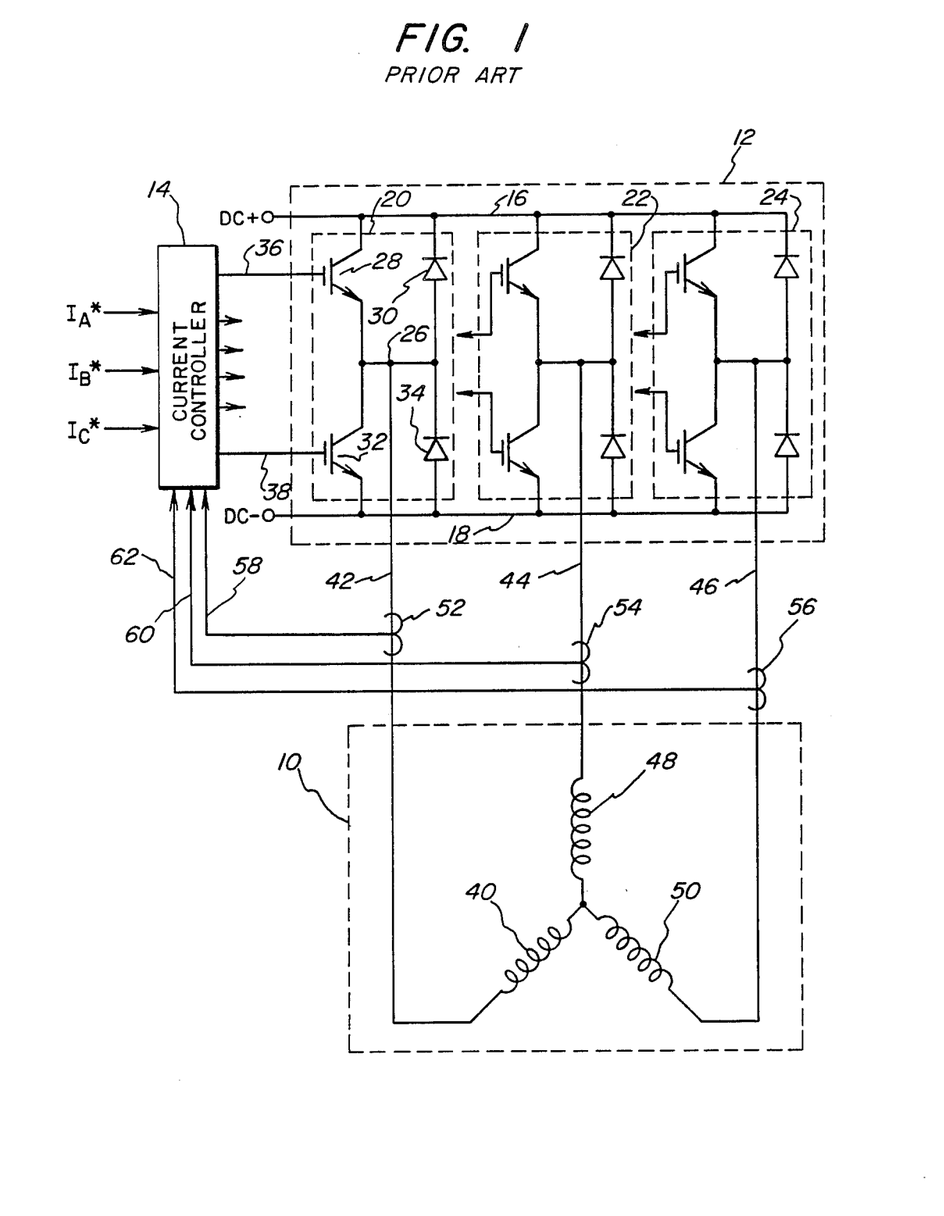
FIG. 1 is a schematic diagram of a prior art AC motor drive including discrete current sensors in series with the motor phase windings.

With reference to the drawings, FIG. 1 illustrates a prior art three-phase AC motor drive for supplying stator current to an induction or synchronous motor 10, only the stator windings of which are represented. These windings comprise phase windings 40, 48 and 50. The basic elements of the motor drive include a DC power source (not shown), a three-phase full-wave bridge inverter 12, and a current controller 14.

Inverter 12 includes a positive DC input bus 16, a negative DC input bus 18, and three substantially identical phase-legs 20, 22 and 24. Each phase-leg supplies an AC output current to a different phase, respectively, of motor 10. Phase-leg 20 includes an AC output terminal 26, an insulated gate bipolar transistor (IGBT) 28 and a flyback diode 30 connected in parallel between positive DC bus 16 and AC terminal 26, and an insulated gate bipolar transistor 32 and flyback diode 34 connected in parallel between negative DC bus 18 and AC terminal 26. IGBT 28 has its collector connected to positive DC bus 16 and its emitter connected to AC terminal 26, while flyback diode 30 has its cathode connected to positive DC bus 16 and its anode connected to AC terminal 26. IGBT 32 has its collector connected to AC terminal 26 and its emitter connected to negative DC bus 18, while flyback diode 34 has its cathode connected to AC terminal 26 and its anode connected to negative DC bus 18. The gate terminals of IGBTs 28 and 32 are connected to current controller 14 through conductors 36 and 38, respectively. Conductor 42 passes current between AC terminal 26 and phase winding 40 of motor 10. Similarly, phase-legs 22 and 24 provide current to phase windings 48 and 50 of motor 10 through conductors 44 and 46, respectively.

In operation, a DC voltage is applied across DC input buses 16 and 18. Current controller 14 operates IGBTs 28 and 32 in accordance with a current command signal $I_A^*$ to produce an AC current at output terminal 26. IGBTs 28 and 32 are operated so that no more than one of the two IGBTs is gated on at any instant of time. When IGBT 28 is gated on via control line 36, load current flows either through IGBT 28 or diode 30, depending on the direction of current in the inductive motor phase winding 40. Similarly, a gating signal applied to IGBT 32 via control line 38 causes current to flow either through IGBT 32 or diode 34. Thus an AC current is produced at output terminal 26 by alternately applying gating signals to IGBTs 28 and 32.

The actual current in conductor 42 and phase winding 40 is sensed by a discrete current sensor 52, such as a Hall-effect current transducer, and a signal proportional to the actual current is generated and fed back to current controller 14 via feedback conductor 58. Current transformers cannot be used as the current sensors since current transformers are insensitive to any DC component in the measured phase current. The current controller includes means known in the art for comparing the feedback signal generated by current sensor 52 to the current command signal for phase-leg 20 and modifying the gating of IGBTs 28 and 32 to bring the actual current in phase winding 40 into agreement with the commanded AC current waveform. Current controller 14 may be one of the types discussed by D. M. Brod and D. W. Novotny in "Current Control of VSI-PMW Inverters", *IEEE Transaction on Industry Applications,* Vol. IA-21, pp. 562–570, May/June 1985.

Similarly, the IGBTs of phase-legs 22 and 24 are operated by current controller 14 in accordance with current command signals $I_B^*$ and $I_C^*$ to produce selected AC current waveforms in phase windings 48 and 50, respectively. Discrete current sensors 54 and 56 generate respective feedback signals for phase-legs 22 and 24.

Figure 2A:
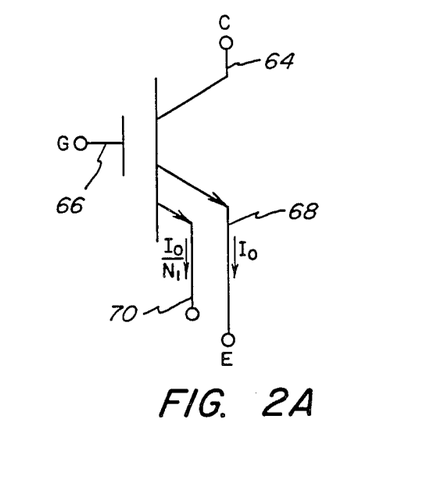
FIGS. 2A and 2B illustrate symbols used in subsequent figures to represent an insulated gate bipolar transistor having an integrated current sensor and a diode having an integrated current sensor, respectively.

The present invention eliminates the discrete current sensors 52, 54 and 56 shown in FIG. 1 by using current sensors integrated into the power semiconductors. An n-channel insulated gate bipolar transistor having an integrated current sensor is shown in FIG. 2A. Within the IGBT device, but not schematically shown, is a main current-carrying section and a current sensing section, both sections being formed onto one semiconductor wafer. The external connections of the IGBT device include a collector 64, a control gate 66 and an emitter 68, all of which connect internally to the main current-carrying section, and a current sensing terminal 70 which is connected internally to the current-carrying section of the device. The device is constructed such that, during operation, the current sensing section and terminal 70 produce a sensor current that is proportional to the current in the main section. As shown in FIG. 2A, the sensor current flowing out of terminal 70 is $I_o/N_1$, where $I_o$ is the IGBT emitter current flowing in terminal 68 and $N_1$ is the ratio between the emitter current and the sensing section current. The ratio $N_1$ is set by the physical design of the IGBT. Details of the construction and operation of the IGBT device are shown and described in the aforementioned Walden and Wildi application Ser. No. 892,739.

Figure 2B:
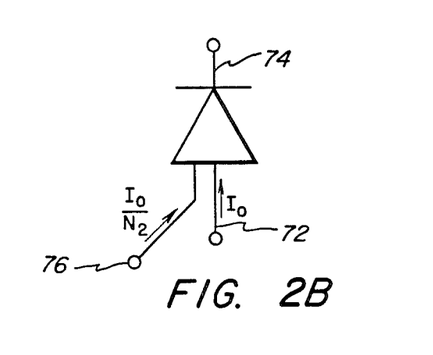

FIG. 2B shows a diode having an integrated current sensor. The diode also includes, in one semiconductor device, a main current-carrying section and a current sensing section. The anode 72 and cathode 74 connect internally with the main current-carrying section of the device and terminal 76 connects internally to the current-sensing section. During operation, the current sensing section and terminal 76 produce a sensor current proportional to current in the main current-carrying section of the diode. As shown in FIG. 2B, the sensor current flowing into terminal 76 is $I_o/N_2$, where $I_o$ is the anode current in terminal 72 and $N_2$ is the ratio between the anode current and the sensing section current. The ratio $N_2$ is set by the design of the diode. A diode of this type is described in the aforementioned application Ser. No. 892,739.

Figure 3A:
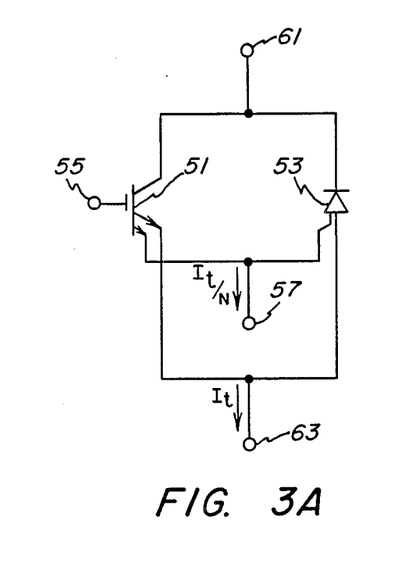
FIG. 3A is a schematic diagram of a basic building block for a three-phase, full-wave bridge inverter in an AC motor drive, employing one device of the type shown in FIG. 2A and one of the type shown in FIG. 2B.

Referring again to FIG. 1, the basic building block for the three-phase inverter is the parallel combination of an IGBT and a flyback diode, such as IGBT 28 and diode 30. The complete inverter is comprised of six of these IGBT-diode combinations as shown in FIG. 1. A key element in the present invention, as shown in FIG. 3A, comprises a parallel combination of IGBT 51 and flyback diode 53 in which both devices contain integral current sensors. Provided that the IGBT and the diode are designed to have the same ratio N between their individual sensing section currents and the current in their main sections, the two sensor terminals can be directly connected at terminal 57. This direct connection is possible since the current sensor sections in the IGBT and the diode are referred to the same reference node, terminal 63. With these connections, the combined sensor current flowing out of (or into) terminal 57 is $I_t/N$, where $I_t$ is the total current in the IGBT-diode combination, defined to be positive when current flows out of terminal 63. It should be noted that the current flowing into terminal 61 is $I_t \times (N+1)/N$ which is almost identical to $I_t$ provided that N is large. Typical values for N are over 1000, so that the current in terminal 61 can be considered equal to the terminal 63 current with an error no larger than 0.1 percent.

Figure 3B:
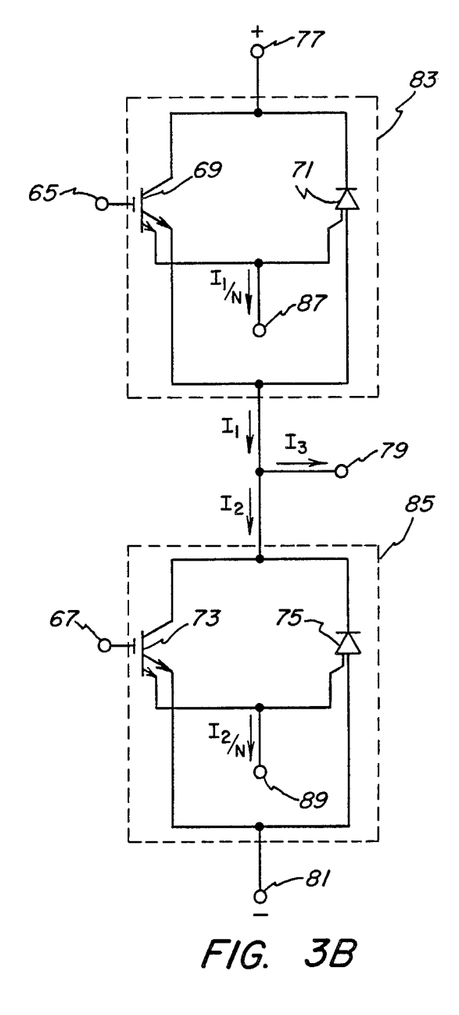
FIG. 3B is a schematic diagram illustrating the series connection of two of the basic building blocks shown in FIG. 3A.

Two of the IGBT-diode combinations including the integral current sensors can be connected in series, as shown in FIG. 3B, to form an inverter phase leg configuration. IGBT 69 has its collector connected to positive DC bus 77 and its emitter connected to the AC output terminal 79. Flyback diode 71 has its cathode connected to positive DC bus 77 and its anode connected to AC output terminal 79. IGBT 73 has its collector connected to AC output terminal 79 and its emitter connected to negative DC bus 81. Flyback diode 75 has its cathode connected to AC output terminal 79 and its anode connected to negative DC bus 81. IGBTs 69 and 73 are controlled by conventional logic circuitry (not shown) which applies voltages to gate terminals 65 and 67. This logic circuitry insures that IGBTs 69 and 73 are never turned on at the same time, avoiding any short circuit across the DC source terminals 77 and 81.

Current $I_3$ flowing out of (or into) terminal 79, shown in FIG. 3B, must be measured to regulate current flowing to the motor. FIG. 3B also indicates that current $I_1$ flows out of the upper IGBT-diode combination 83, while current $I_2$ flows into the lower IGBT-diode combination 85. Kirchoff's current law demands that the load current $I_3$ equal the sum of $I_1+(-I_2)$, so that current $I_3$ can be reconstructed if currents $I_1$ and $I_2$ are known separately. Since both the upper and lower IGBT-diode combinations 83 and 85, respectively, in FIG. 3B include integral current sensors, measurements of currents $I_1$ and $I_2$ are available at terminals 87 and 89, respectively, to reconstruct the desired load current $I_3$ measurement.

Figure 4:
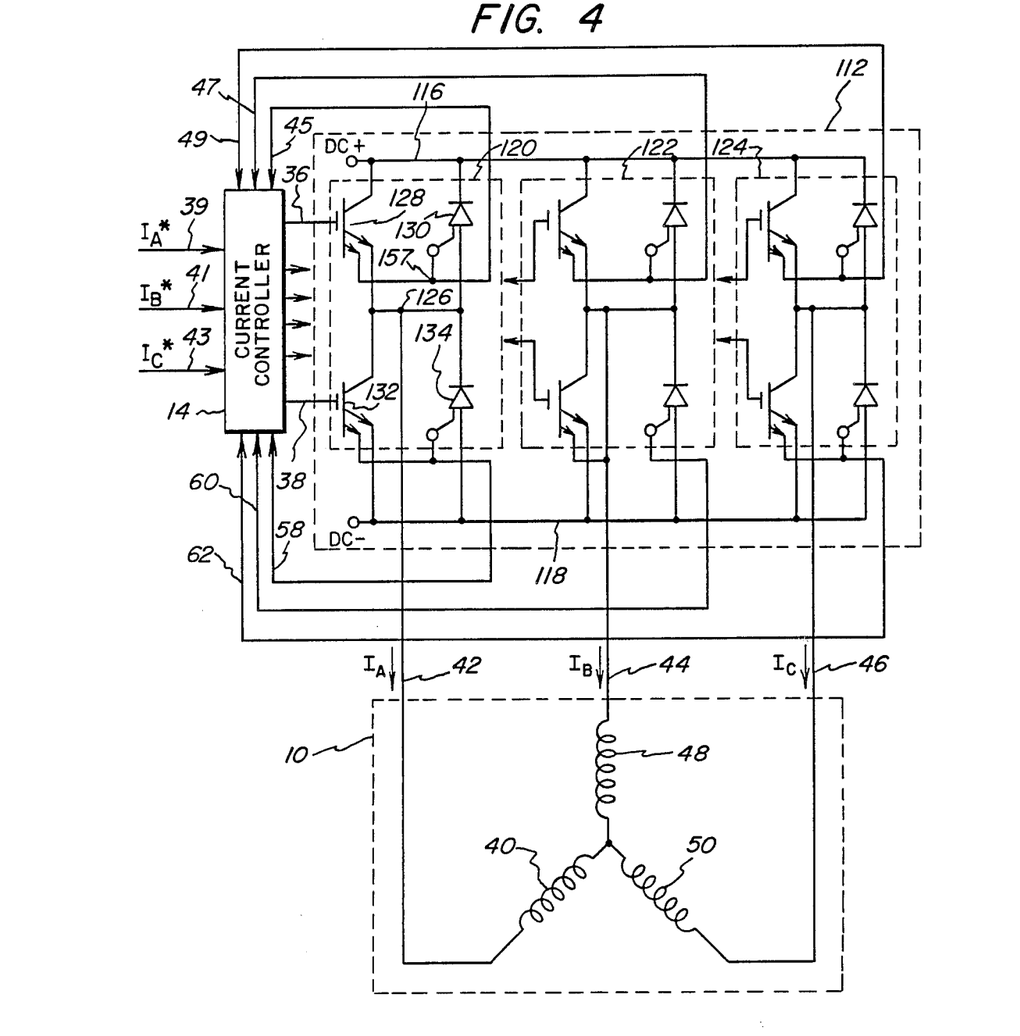
FIG. 4 is a schematic diagram of a preferred embodiment of the present invention, wherein an AC motor drive includes a three-phase full-wave bridge inverter.

FIG. 4 illustrates a preferred embodiment of a three-phase AC motor drive in accordance with the present invention. Inverter 112 includes three substantially identical phase-legs 120, 122 and 124, each connected between positive DC input bus 116 and negative DC input bus 118. Each of the three phase-legs is configured as shown in FIG. 3B. For example, phase-leg 120, which supplies current to phase winding 40 of motor 10, includes an AC output terminal 126, insulated gate bipolar transistors 128 and 132 having integrated current sensors, and flyback diodes 130 and 134 having integrated current sensors.

Current controller 14 alternately operates IGBTs 128 and 132 of phase-leg 120 via gate terminals 36 and 38, respectively, in order to produce a desired AC current waveform in phase winding 40. Measurements of current in the upper IGBT-diode pair 128 and 130, respectively, are fed back to the current controller 14 via conductor 45, and measurements of current in the lower IGBT-diode pair 132 and 134, respectively, are fed back by a separate conductor 58. Current controller 14 combines these two separate measurements to provide a measurement of the total phase-leg output current $i_A$ delivered to the motor over conductor 42. The current controller regulates the switching operation of IGBTs 128 and 132 to bring the actual phase-leg output current $I_A$ in conductor 42 into agreement with the commanded current waveform $I_A^*$ delivered to the current controller on conductor 39. Phase-legs 122 and 124 are substantially identical to phase-leg 120 in construction and similar in operation except that the current waveforms $I_B$ and $I_C$ flowing in conductors 44 and 46, respectively, are 120° and 240°, respectively, out of phase with the waveform of current $I_A$ of phase-leg 120.

Referring back to FIG. 3A, the sensor output signal at terminal 57 is a scaled current $I_t/N$ which is proportional to the total phase-leg current $I_t$ flowing out of the IGBT-diode combination through terminal 63. It is typically convenient for the current controller to convert this small sensor current into a voltage representing the measured current $I_t$ which is then used by the current controller to regulate the amplitude of current $I_t$.

Figure 5A:
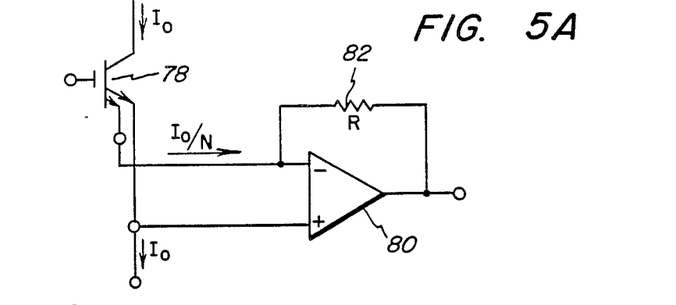
FIGS. 5A–5D are schematic diagrams of different types of circuits for converting the current from each current sensor into an output voltage.

FIG. 5A illustrates a circuit for converting the current derived from an IGBT to a voltage signal. The emitter of IGBT 78 is connected to the positive input terminal of an operational amplifier 80, while the current sensing terminal of IGBT 78 is connected to the negative input terminal of operational amplifier or op-amp 80. A feedback resistor 82 is connected between the op-amp negative input terminal and its output terminal. The amplitude of the output voltage referenced to the IGBT 78 source, assuming ideal op-amp characteristics, will be $-(I_o \times R/N)$, where:

$I_o$ = current in the main current section of IGBT 78;
R = ohmic value of resistor 82; and
N = ratio between the main-section current and the current-sensing-section current in IGBT 78.

Figure 5B:
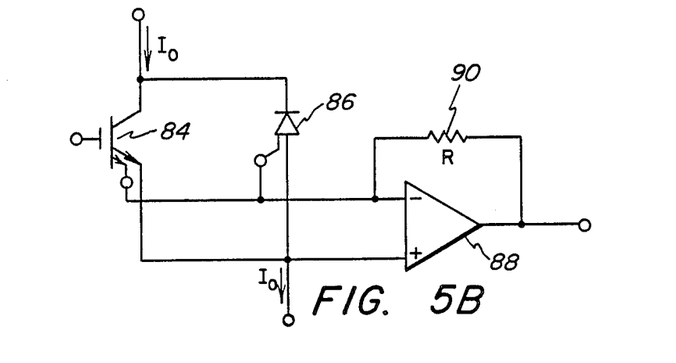

FIG. 5B shows a circuit for providing a voltage signal proportional to the sensor current combination derived from an IGBT and a flyback diode connected in parallel, the IGBT and diode having the same current sensing ratio, N. The emitter of IGBT 84 and the anode of diode 86 are connected to the positive input terminal of op-amp 88 and the current sensing section terminals of both devices are connected to the negative input terminal of the op-amp. A feedback resistor 90 is connected between the negative input terminal and the output terminal of op-amp 88. The output voltage signal from the op-amp, referenced to the IGBT 84 source, is $-(I_o \times R/N)$, assuming ideal op-amp characteristics, where:

$I_o$ = total current in the main current-carrying sections of IGBT 84 and diode 86;
R = ohmic value of resistor 90; and
N = current sensing ratio discussed above with reference to FIG. 5A.

Figure 5C:
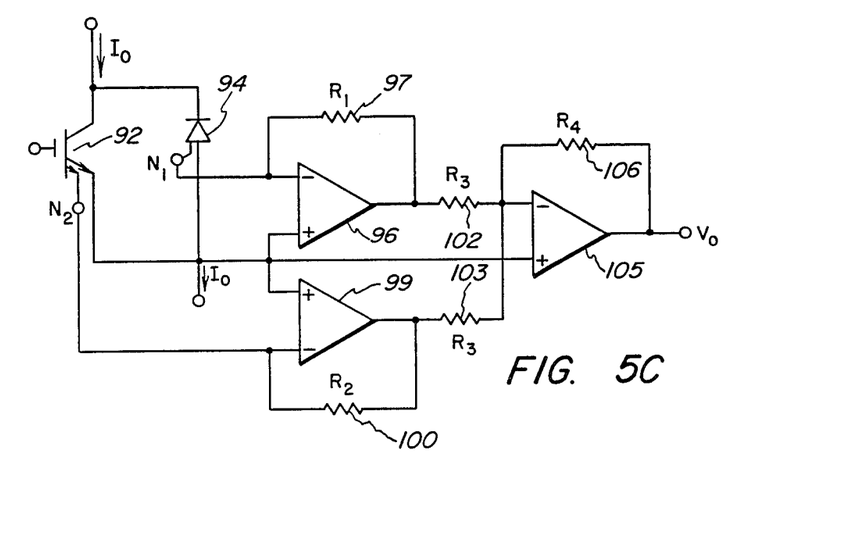

FIG. 5C shows another circuit for generating a voltage signal proportional to the sensor current combination derived from an IGBT and a flyback diode connected in parallel, the IGBT and diode having different current sensing ratios. The emitter of IGBT 92 and the anode of diode 94 are connected to the positive input terminals of a set of op-amps 96, 99 and 105. The current sensing terminal of IGBT 92 is connected to the negative input terminal of op-amp 99, while the current sensing terminal of diode 94 is connected to the negative input terminal of op-amp 96. The output terminals of op-amps 96 and 99 are connected to resistors 102 and 103, respectively. Resistors 102 and 103 are both further connected to the negative input terminal of op-amp 105. The op-amps may be considered to have ideal characteristics.

Feedback resistors 97, 100 and 106 are arranged between the negative input terminals and output terminals of op-amps 96, 99 and 105, respectively. $R_2$ is selected to be equal to $R_1 \times N_2/N_1$, where $R_1$ and $R_2$ are the ohmic values of resistors 97 and 100, respectively, and $N_1$ and $N_2$ are the current sensing ratios of diode 94 and IGBT 92, respectively. The ohmic value of each of resistors 102 and 103 is chosen equal to $R_3$. Thus, the output voltage signal from op-amp 105 will be $(I_o \times R_1 \times R_4)/(N_1 \times R_3)$, where:

$I_o$ = total current in the main current-carrying section of IGBT 92 and diode 94;
$R_1$ = ohmic value of resistor 94;
$R_3$ = ohmic value of resistors 102 and 103;
$R_4$ = ohmic value of resistor 106; and
$N_1$ = current sensing ratio for diode 94.

Figure 5D:
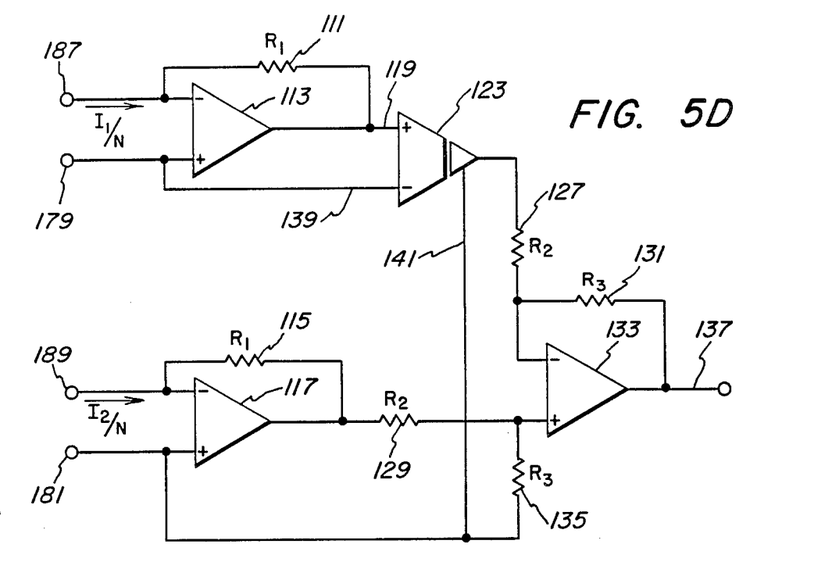

FIG. 5D shows a signal conditioning circuit which converts the integrated current sensor signals from the upper and lower IGBT-diode combinations 83 and 85, respectively, shown in FIG. 3B, into a single output voltage proportional to the phase-leg AC output load current. The emitter-anode terminal 79 from the upper IGBT-diode combination 83, shown in FIG. 3B, is connected in the circuit of FIG. 5D to the positive input terminal 179 of op-amp 113, and the current sensing section terminal 87 from the upper IGBT-diode pair 83 of FIG. 3B is connected in the circuit of FIG. 5D to the negative input terminal 187 of the op-amp. The emitter-anode terminal 81 from the lower IGBT-diode combination 85, shown in FIG. 3B, is connected in the circuit of FIG. 5D to the positive input terminal 181 of op-amp 117, and the current sensing section terminal 89 from the lower IGBT-diode pair 85 of FIG. 3B is connected in the circuit of FIG. 5D to the negative input terminal 189 of the op-amp. In FIG. 3B, the current sensor output 87 signal from the upper IGBT-diode pair 83 is $I_1/N$ and the sensor output 89 signal from the lower IGBT-diode pair 85 is $I_2/N$. These signals are indicated at input terminals 187 and 189 in FIG. 5D.

Op-amps 113 and 117 in FIG. 5D are each connected in the same circuit configuration as shown in FIG. 5B so that the output voltage from op-amp 113 is $-(I_1 \times R_1/N)$ and the output voltage from op-amp 117 is $-(I_2 \times R_1/N)$. Amplifier 123 is an isolation amplifier with a gain of 1 whose output voltage is galvanically isolated from the input terminals 119 and 139 in order to provide level-shifting. This element is needed since the integrated current sensors in the upper and lower IGBT-diode pairs are referred to different voltage levels. Again referring back to FIG. 3B, the emitter-anode connection 81 for the lower IGBT-diode pair 85 is connected to the negative DC source voltage, whereas the voltage at the emitter-anode connection 79 for the upper IGBT-diode pair 83 switches between the positive and negative DC source voltages 77 and 81 depending on the IGBT conduction states. As a result of this voltage difference, it is necessary to use some means such as an isolation amplifier to provide level-shifting so that the current sensor signals from the upper and lower IGBT-diode pairs can be electrically combined. The output stage of isolation amplifier 123 of FIG. 5D is referred to the negative DC source voltage by means of conductor 141.

The output voltage from isolation amplifier 123 is $-(I_1 \times R_1/N)$ since the gain of this amplifier is unity. This output voltage is applied to the negative input terminal of op-amp 133 through a resistor 127 of ohmic value $R_2$, and the output voltage of op-amp 117 is applied to the positive input of op-amp 133 through a resistor 129 with the same ohmic value $R_2$. Op-amp 133 serves as a difference amplifier in this circuit. Accordingly, resistor 135 with value $R_3$ is connected between the positive input terminal of op-amp 133 and reference voltage terminal 181. Feedback resistor 131 connected between the output terminal 137 of op-amp 133 and the negative input terminal has the same ohmic value $R_3$. As a result, the output voltage from this circuit at terminal 137 is $(I_1-I_2) \times R_1 \times R_3/(R_2 \times N)$ where N is the current sensing ratio for all of the IGBT and diode sensor elements, and where the op-amps are considered to have ideal characteristics. As described earlier with reference to FIG. 3B, $(I_1-I_2)$ is equal to the phase-leg AC output current $I_3$, so that the output voltage at terminal 137 developed in FIG. 5D is proportional to the load current as desired. This load current measurement can then be used as feedback information to replace a discrete current sensor (such as sensor 52, 54 or 56) in the prior art scheme illustrated in FIG. 1.

Figure 6:
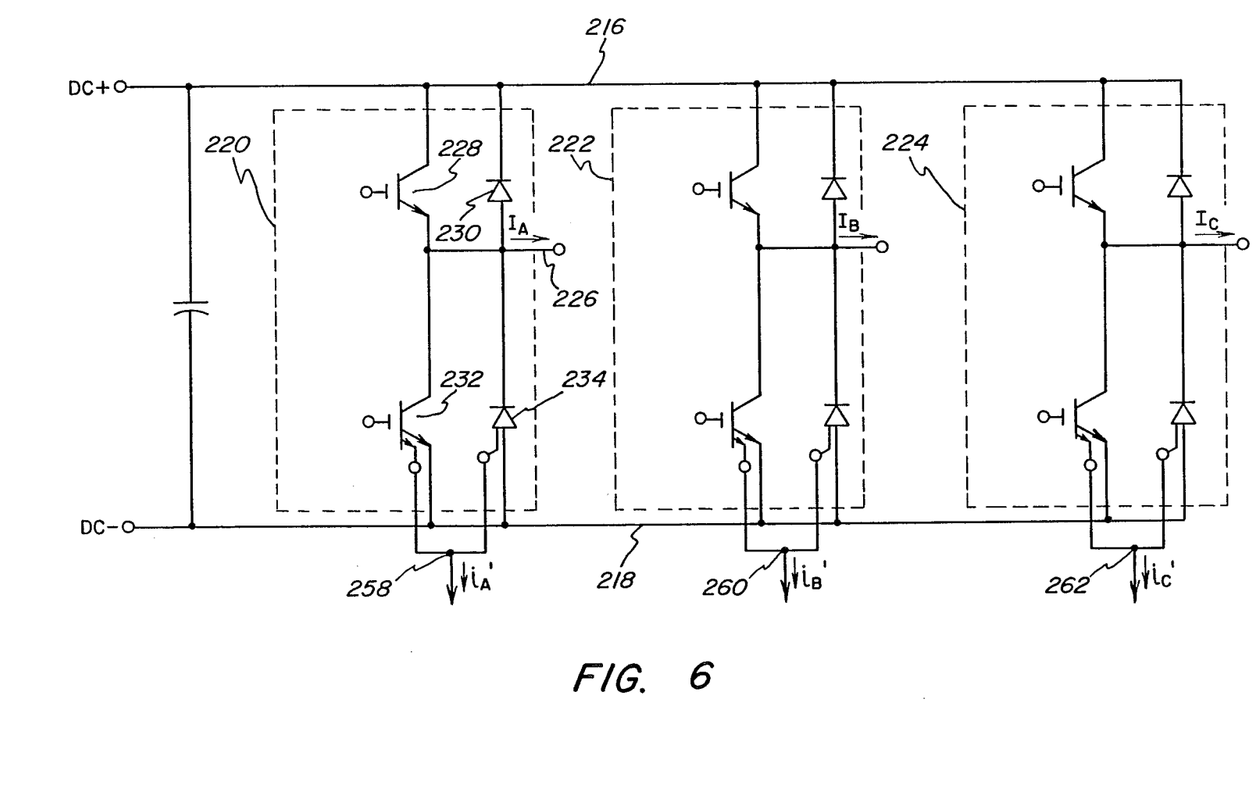
FIG. 6 is a schematic diagram of a three-phase full-wave bridge inverter in accordance with another embodiment of the present invention.
Figure 7:
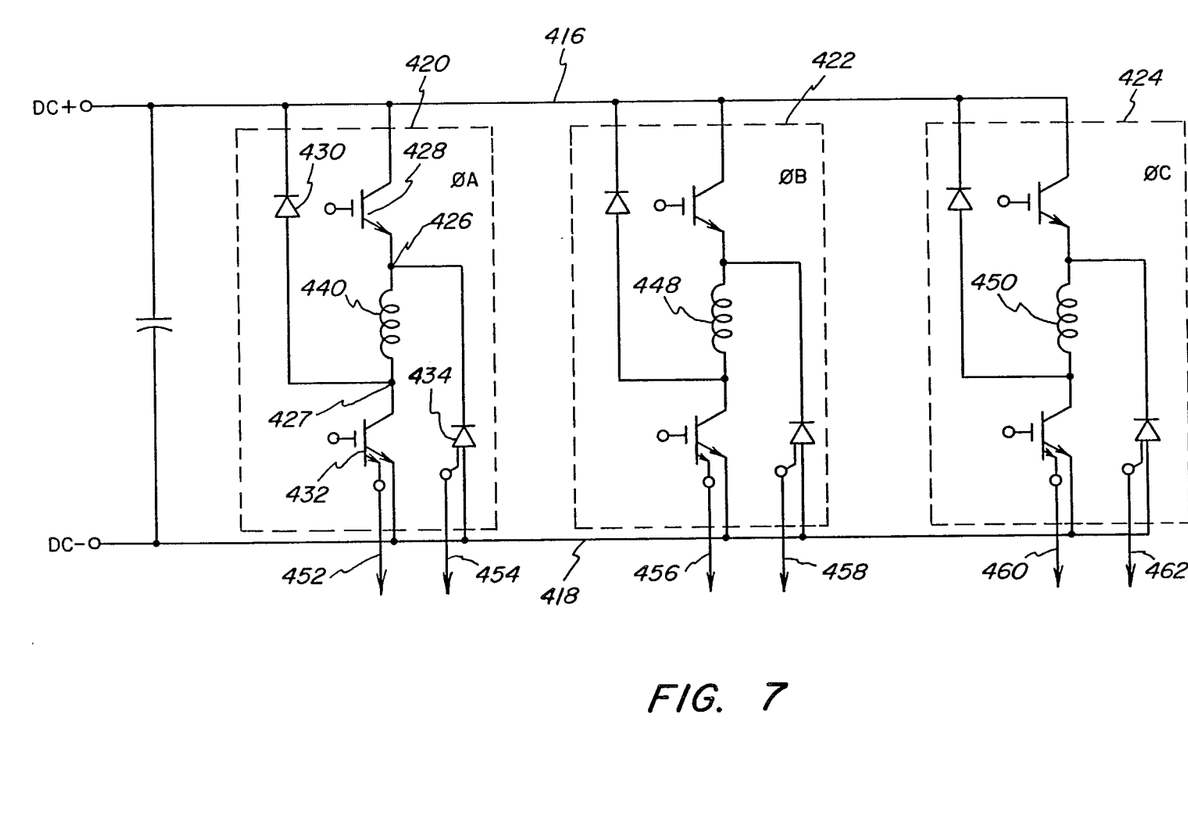
FIG. 7 is a schematic diagram of a switched reluctance motor drive inverter in accordance with a further embodiment of the present invention.

Alternative embodiments of the invention are illustrated in FIGS. 6 and 7, wherein different constructions of inverter 112 of FIG. 4 are shown. In the embodiments shown in FIGS. 6 and 7, as is also the case with the preferred embodiment shown in FIG. 4, current controller 14 is connected to receive feedback information from a first group of semiconductor devices consisting of those IGBTs and diodes which have integrated current sensors. Current controller 14 uses this current feedback information in combination with current command signals to develop output gating commands which are delivered to all of the IGBTs in the inverter to control their conduction states.

FIG. 6 shows a three-phase full-wave bridge inverter which is configured so that only the devices connected to the negative DC input bus contain current sensing sections. This configuration eliminates signal conditioning difficulties associated with extracting current data from the switches connected to the positive DC bus as shown in FIG. 4. These difficulties are due to common-mode voltage components which must be eliminated from the feedback signal and which arise because the emitters of the upper phase-leg IGBTs, i.e. the IGBTs connected to the positive DC input bus, are being switched between the positive and negative DC bus voltages at high frequencies. This embodiment eliminates the need for special level-shifting elements such as the isolation amplifier 123 in FIG. 5D.

In the circuit of FIG. 6, the inverter comprises a positive DC input bus 216, a negative DC input bus 218, and three phase-legs 220, 222 and 224. Phase-leg 220 includes an AC output terminal 226, an IGBT 228 and a flyback diode 230 connected between positive DC bus 216 and AC terminal 226, and an IGBT 232 and a flyback diode 234 connected between negative DC bus 218 and AC terminal 226. IGBT 232 and diode 234 contain current sensing sections. The current sensing terminals of IGBT 232 and diode 234 provide sensor current feedback signals $i_4'$ at terminal 258 from phase-leg 220 to the current controller, as shown in FIG. 4. In this configuration, however, feedback data are generated only when IGBT 232 and diode 234 are carrying current. Phase-legs 222 and 224 are identically configured and operate in a similar manner. A control algorithm for regulating the output current when only partial feedback information is available is described in Jahns patent application Ser. No. 140,685 1/4/88 filed concurrently herewith and assigned to the assignee of the present invention.

In accordance with a further embodiment of the invention, a variable frequency three-phase switched-reluctance motor drive inverter is shown in FIG. 7. The inverter comprises a positive DC input bus 416, a negative DC input bus 418, and three phase-legs 420, 422 and 424. Phase-leg 420 includes a pair of output terminals 426 and 427 which are connected to motor phase winding 440. An IGBT 428 has its collector connected to positive DC bus 416 and its emitter connected to output terminal 426, and a flyback diode 430 has its cathode connected to positive DC bus 416 and its anode connected to output terminal 427. An IGBT 432 has its collector connected to output terminal 427 and its emitter connected to negative DC bus 418, and a flyback diode 434 has its cathode connected to output terminal 426 and its anode connected to negative DC bus 418.

In operation, a voltage potential is applied across DC input buses 416 and 418. The current controller (not shown) operates IGBTs 428 and 432 in accordance with a current command signal to provide current to motor phase winding 440. The current in winding 440, which is connected between output terminals 426 and 427, passes unidirectionally between DC input buses 416 and 418. However, the magnitude of this current is made to vary by operation of IGBTs 428 and 432. The operation of IGBTs 428 and 432 differs from operation of their counterparts in the synchronous motor or induction motor drives described previously, in that IGBTs 428 and 432 are both switched into conducting (or non-conducting) states concurrently during a portion of their respective operating cycles.

Only the IGBTs and diodes connected to the negative DC bus 418 incorporate current sensors therein. For example, only IGBT 432 and diode 434 in phase-leg 420 include integrated current sensors providing sensor output current signals on conductors 452 and 454, respectively. As mentioned above, the inverter for the switched reluctance motor differs from the previously-described AC motor inverters in that both IGBTs in a phase-leg for the switched reluctance motor can be turned on at the same time. As a result, the inverter can be operated so that complete information about the motor load current flowing in winding 440 is always available, even though the upper IGBT 428 and diode 430 do not include integrated current sensors. Signal conditioning circuits to convert the sensor output currents from the lower phase-leg IGBTs and diodes into voltages can be accomplished using simple op-amp circuits as described previously in conjunction with FIG. 5. Since all of the lower phase-leg current sensors are referred to the same reference voltage on bus 418, no special level-shifting elements such as isolation amplifiers are necessary to reconstruct the motor current measurements.

Figure 8:
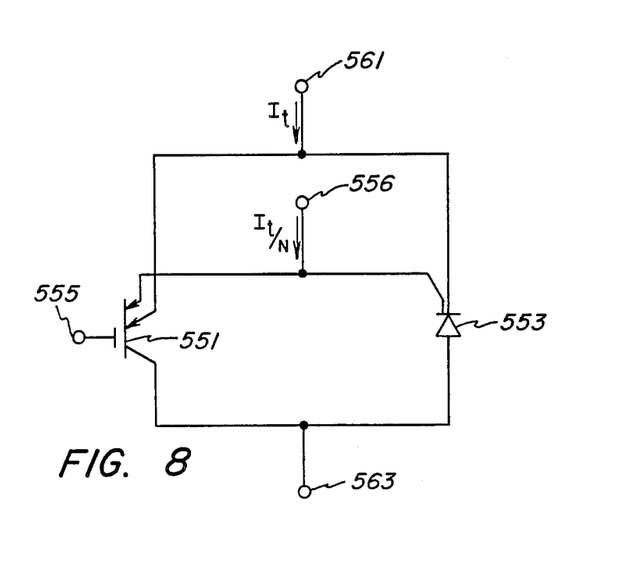
FIG. 8 is a schematic diagram of a basic building block for a three-phase full-wave bridge inverter in an AC motor drive, employing a p-channel IGBT with an integrated current sensor and a diode with an integrated current sensor referred to the cathode terminal.

Although the invention described herein has thus far been described in terms of n-channel power devices, the techniques apply equivalently to p-channel devices. For example, the upper IGBT 128-diode 130 combination in FIG. 4, employing an n-channel IGBT, can be replaced by the corresponding p-channel IGBT-diode combination as shown in FIG. 8. IGBT 551 is a p-channel device with an integrated current sensor, and diode 553 is designed to include a current sensing section referred to the cathode terminal. As a result, the current sensors in IGBT 551 and diode 553 are both referred to emitter-cathode connection terminal 561. Assuming that the IGBT and diode are designed to have the same current sensor ratio N, the sensor current flowing into terminal 556 is a scaled version $I_t/N$ of the total current $I_t$ flowing into (or out of) the emitter-cathode terminal 561. Signal conditioning circuits such as shown in FIG. 5B to convert the sensor current into sensor voltages are easily adapted to the p-channel IGBT-diode combination of FIG. 8 by using the emitter-cathode terminal 561 as the circuit reference node instead of the emitter-anode connection in the n-channel version.

The preceding discussion and accompanying drawings describe a new and improved current sensor configuration for an AC motor drive which makes it possible to achieve current control without requiring discrete current sensors in the individual motor phase windings. The circuitry can be constructed simply and economically and permits a reduction in the size of AC motor drives through the elimination of discrete current sensors and their associated volume and weight penalties.

From the foregoing specification, it will be clear to those skilled in the art that the invention is not limited to the specific embodiments described and illustrated and that numerous modifications and changes are possible without departing from the scope of the present invention. For example, although the preceding discussion has dealt with AC drives for three-phase motors, the invention is equally applicable to AC supplies for any polyphase load. Also, while the drive inverters described and shown employ insulated gate transistors and flyback diodes, the main switching devices may employ any of a variety of MOS (metal-oxide-semiconductor)-gated devices or even bipolar transistors rather than insulated gate bipolar transistors, with integral current-sensing portions where appropriate.

Other variations, changes, substitutions and equivalents will be readily apparent to those skilled in the art without departing from the spirit and scope of the invention. Accordingly, it is intended that the invention to be secured by Letters Patent be limited only by the scope of the appended claims.

What is claimed is:

1. A building block for an inverter, said inverter including a pair of input buses for receiving a DC input voltage and producing an AC voltage at an AC output terminal thereof, and control means responsive to currents in said building block for supplying control signals thereto, said building block comprising:
    a first three-terminal semiconductor power switching device including a first integral current sensor, first and second power terminals, and a control terminal;
    a first diode including a second integral current sensor and first and second diode terminals;
    means coupling the first power terminal and the first diode terminal to one of said input buses;
    means coupling the second power terminal and the second diode terminal to said AC output terminal;
    circuit means coupling said AC output terminal to the other of said input buses; and
    means coupling said first and second integral current sensors to said control means for supplying feedback information thereto, said control means supplying a control signal to control terminal.

2. The apparatus of claim 1 wherein said one of said input buses is of positive polarity, said other of said input buses is of negative polarity, said first diode terminal comprises a cathode terminal and said second diode terminal comprises an anode terminal.

3. The apparatus of claim 1 wherein said one of said input buses is of negative polarity, said other of said input buses is of positive polarity, said first diode terminal comprises an anode terminal and said second diode terminal comprises a cathode terminal.

4. The apparatus of claim 1 wherein said circuit means includes a second building block comprising:
    a second three-terminal semiconductor power switching device including a third integral current sensor, third and fourth power terminals, and a second control terminal;
    a second diode including a fourth integral current sensor and third and fourth diode terminals;
    means coupling the third power terminal and the third diode terminal to said AC output terminal;

means coupling the fourth power terminal and the fourth diode terminal to the other of said input buses; and means coupling said third and fourth integral current sensors to said control means for supplying a second feedback signal thereto, said control means supplying a second control signal to said second control terminal.

5. The apparatus of claim 4 wherein said one of said input buses is of positive polarity, said other of said input buses is of negative polarity, said first and third diode terminals comprise cathode terminals and said second and fourth diode terminals comprise anode terminals.

6. The apparatus of claim 4 wherein said one of said input buses is of negative polarity, said other of said input buses is of positive polarity, said first and third diode terminals comprise anode terminals and said second and fourth diode terminals comprise cathode terminals.

7. The apparatus of claim 1 wherein the ratio of sensing section current to main section current of said three-terminal semiconductor power switching device is unequal to the ratio of sensing section current to said main section current of said diode, said first and second integral current sensors supplying separate feedback signals, respectively, to said control means.

8. The apparatus of claim 1 wherein the ratio of sensing section current to main section current of said three-terminal semiconductor power switching device is equal to the ratio of sensing section current to main section current of said diode, said means coupling said first and second integral current sensors to said control means further being directly connected to each other.

9. A building block for an inverter, said inverter including a pair of input buses for receiving a DC input voltage and producing an AC voltage at an AC output terminal thereof, and control means responsive to currents in said building block for supplying control signals thereto, said building block comprising:
a first MOS-gated semiconductor power switching device including a first integral current sensor, a gate terminal and first and second power terminals, respectively;
a first diode including a second integral current sensor and first and second diode terminals;
means coupling the first power and first diode terminals to one of said input buses;
means coupling the second power and second diode terminals to said AC output terminal;
circuit means coupling said AC output terminal to the other of said input buses; and
means coupling said first and second integral current sensors to said control means for supplying a feedback signal thereto, said control means supplying a control signal to said gate terminal.

10. The apparatus of claim 9 wherein said one of said input buses is of positive polarity, said other of said input buses is of negative polarity, said first diode terminal comprises a cathode terminal and said second diode terminal comprises an anode terminal.

11. The apparatus of claim 10 wherein said MOS-gated semiconductor device comprises an IGBT.

12. The apparatus of claim 9 wherein said MOS-gated semiconductor device comprises an IGBT.

13. The apparatus of claim 9 wherein said one of said input buses is of negative polarity, said other of said input buses is of positive polarity, said first diode terminal comprises an anode terminal and said second diode terminal comprises a cathode terminal.

14. The apparatus of claim 13 wherein said MOS-gated semiconductor device comprises an IGBT.

15. The apparatus of claim 9 wherein said circuit means includes a second building block comprising:
a second MOS-gated semiconductor device including a third integral current sensor, gate terminal and third and fourth power terminals;
a second diode including a fourth integral current sensor and third and fourth diode terminals;
means coupling the third power and third diode terminals to said AC output terminal;
means coupling the fourth power and fourth diode terminals to the other of said input buses; and
means coupling said third and fourth integral current sensors to said control means for supplying a second feedback signal thereto, said control means supplying a second control signal to said second gate terminal.

16. The apparatus of claim 15 wherein said one of said input buses is of positive polarity, said other of said input buses is of negative polarity, said first and third diode terminals comprise cathode terminals and said second and fourth diode terminals comprise anode terminals.

17. The apparatus of claim 16 wherein each of said MOS-gated semiconductor devices comprises an IGBT.

18. The apparatus of claim 15 wherein each of said MOS-gated semiconductor devices comprises an IGBT.

19. The apparatus of claim 15 wherein said one of said input buses is of negative polarity, said other of said input buses is of positive polarity, said first and third diode terminals comprise anode terminals and said second and fourth diode terminals comprise cathode terminals.

20. The apparatus of claim 19 wherein each of said MOS-gated semiconductor devices comprises an IGBT.

21. A polyphase full-wave bridge inverter comprising: positive and negative DC input buses;
a plurality of phase-legs each including an AC output terminal, respectively;
each of said phase-legs further including a set of semiconductor devices comprising an upper transistor and an upper flyback diode connected in parallel between said positive DC input bus and said AC output terminal, and a lower transistor and a lower flyback diode connected in parallel between said negative DC input bus and said AC output terminal;
a separate current sensor integral with at least each of said lower transistors and lower flyback diodes respectively, each of said current sensors being responsive to current flow through its respective integral semiconductor device to provide a proportional sensor current; and
means in each respective phase-leg for deriving a feedback signal from the sensor currents provided by said respective phase-leg.

22. An inverter in accordance with claim 21 wherein each of said upper transistors and upper flyback diodes respectively includes a current sensor integral therewith.

23. An inverter in accordance with claim 21 in which each of said transistors comprises an insulated gate bipolar transistor.

24. An AC drive for supplying a regulated current to a polyphase motor, said drive comprising:
- a full-wave bridge inverter including a pair of positive and negative DC input buses and a phase-leg corresponding to each motor phase;
- each of said phase-legs including an AC output terminal for connection to said motor;
- a set of semiconductor devices comprising an upper transistor and an upper flyback diode connected in parallel between said positive DC input bus and said AC output terminal, and a lower transistor and a lower flyback diode connected in parallel between said negative DC input bus and said AC output terminal;
- a separate current sensor integral with at least each of said lower transistors and lower flyback diodes respectively, each of said sensors being responsive to current flow through its respective integral semiconductor device to provide a proportional sensor current;
- means in each phase-leg for deriving a feedback signal from the sensor currents provided by said phase-leg; and
- a current controller coupled to each of said transistors, said current controller including means for receiving a set of command signals and being responsive to a comparison of said feedback signals with said command signals to control operation of said transistors.

25. An AC motor drive in accordance with claim 24 in which each of said transistors comprises an insulated gate bipolar transistor.

26. An AC motor drive in accordance with claim 24 wherein each of said upper transistors and upper flyback diodes respectively includes a current sensor integral therewith.

27. A variable-frequency drive for supplying a regulated current to a polyphase variable-reluctance motor, said drive comprising:
- a power converter circuit including a pair of positive and negative DC input buses and a phase-leg corresponding to each motor phase, respectively;
- each of said phase-legs including first and second AC output terminals for connection to a first and second side, respectively, of said each motor phase;
- a set of semiconductor devices comprising an upper power switching device connected between one of said DC input buses and said first AC output terminal, a lower power switching device connected between the other of said DC input buses and said second AC output terminal, a lower flyback diode connected between said first AC output terminal and the other of said DC input buses, and an upper flyback diode connected between said one of said DC input buses and said second AC output terminal;
- a separate current sensor integral with each of said lower power switching device and said lower flyback diode, respectively, each of said sensors being responsive to current flow through its respective integral semiconductor device to provide a proportional sensor current;
- a current controller coupled to each of said power switching devices; and
- means coupling each said separate current sensor, respectively, in each phase-leg to said current controller for supplying signals to said current controller, said controller receiving a set of command signals and being responsive to a comparison of said feedback signals with said command signals to control operation of said power switching devices.

28. The apparatus of claim 27 wherein said one of said DC input buses is of negative polarity and said other of said input buses is of positive polarity.

29. The apparatus of claim 28 wherein each of said power switching devices comprises an IGBT.

30. A variable-frequency drive in accordance with claims 27 in which each of said power switching devices comprises an insulated gate bipolar transistor.

31. The apparatus of claim 27 wherein said one of said DC input buses is of positive polarity and said other of said input buses is of negative polarity.

32. The apparatus of claim 31 wherein each of said power switching devices comprises an IGBT.

* * * * *

UNITED STATES PATENT AND TRADEMARK OFFICE
CERTIFICATE OF CORRECTION

PATENT NO. : 4,777,579

DATED : Oct. 11, 1988

INVENTOR(S) : Thomas M. Hahns and Eric J. Wildi

It is certified that error appears in the above-identified patent and that said Letters Patent is hereby corrected as shown below:

The title page should be deleted to appear as per attached page.

Figure 4 of the drawings should be deleted to be replaced with Figure 4 as shown on the attached page.

Signed and Sealed this

Nineteenth Day of September, 1989

Attest:

DONALD J. QUIGG

Attesting Officer

Commissioner of Patents and Trademarks

United States Patent [19]
Jahns et al.

[11] Patent Number: 4,777,579
[45] Date of Patent: Oct. 11, 1988

[54] INTEGRATED CURRENT SENSOR CONFIGURATIONS FOR AC MOTOR DRIVES

[75] Inventors: Thomas M. Jahns, Schenectady, N.Y.; Eric J. Wildi, Chapel Hill, N.C.

[73] Assignee: General Electric Company, Schenectady, N.Y.

[21] Appl. No.: 140,686

[22] Filed: Jan. 4, 1988

[51] Int. Cl.⁴ .................................. H02M 7/5387
[52] U.S. Cl. ................................... 363/98; 363/132
[58] Field of Search ................. 363/17, 25, 26, 48, 363/132, 134

[56] References Cited

U.S. PATENT DOCUMENTS

| | | | |
|---|---|---|---|
| 3,870,943 | 3/1975 | Weischedel et al. | 363/26 |
| 4,126,819 | 11/1978 | Stobbe et al. | 363/132 |
| 4,233,658 | 11/1980 | Lupatin et al. | 363/134 |
| 4,351,020 | 9/1982 | Lati et al. | 363/26 |
| 4,533,836 | 8/1985 | Carpenter et al. | 363/17 |
| 4,710,686 | 12/1987 | Guzik | 363/98 |

OTHER PUBLICATIONS

C-E Cordonnier and D. L. Zaremba, Jr., "Application Considerations for SENSEFET® Power MOSFET Devices", *Power Coversion International Conference Proceedings*, May 1987, pp. 47–65.

W. Schultz, "Lossless Current Sensing with SENSEFETs Enhances Motor Drive Design", *Power Conversion and Intelligent Motion*, Apr. 1986, pp. 30–34.

S. Young, "Current Sensing HEX Sense Power MOSFETs Simplify SMPS Designs and Lower Losses", *Power Conversion and Intelligent Motion*, Jul. 1987, pp. 76–83.

*Primary Examiner*—Patrick R. Salce
*Assistant Examiner*—Jeffery Sterrett
*Attorney, Agent, or Firm*—Marvin Snyder; James C. Davis, Jr.

[57] ABSTRACT

An AC polyphase motor drive includes a current-controlled inverter comprising a plurality of semiconductor devices made up of power switches, such as IGBTs, and diodes. Current sensors integral with respective ones of a first group of the semiconductor devices sense the current delivered to each of the motor phase windings and a controller compares the sensed currents to a set of command signals to control operation of a second group of the semiconductor devices.

32 Claims, 8 Drawing Sheets

FIG. 4